(12) United States Patent
Kato et al.

(10) Patent No.: US 9,559,136 B2
(45) Date of Patent: Jan. 31, 2017

(54) SEMICONDUCTOR DEVICE MANUFACTURING METHOD, AND PHOTOELECTRIC CONVERSION DEVICE

(71) Applicant: CANON KABUSHIKI KAISHA, Tokyo (JP)

(72) Inventors: Aiko Kato, Machida (JP); Yu Nishimura, Kawasaki (JP); Hiroaki Naruse, Oita (JP); Keita Torii, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/618,937

(22) Filed: Feb. 10, 2015

(65) Prior Publication Data

US 2015/0228683 A1    Aug. 13, 2015

(30) Foreign Application Priority Data

Feb. 13, 2014   (JP) .................................. 2014-025732

(51) Int. Cl.
*H01L 27/146*   (2006.01)
*H01L 21/02*    (2006.01)
(Continued)

(52) U.S. Cl.
CPC ... *H01L 27/14636* (2013.01); *H01L 21/31116* (2013.01); *H01L 21/31144* (2013.01);
(Continued)

(58) Field of Classification Search
CPC .................... H01L 27/14687; H01L 27/14638; H01L 27/14632; H01L 27/14627; H01L 27/14612; H01L 27/14636; H01L 27/1462; H01L 27/14685; H01L 21/76807; H01L 21/02359; H01L 21/0214; H01L 21/76808; H01L 21/31144; H01L 21/31116; H01L 2221/1036
(Continued)

(56) References Cited

U.S. PATENT DOCUMENTS 6,235,620 B1   5/2001  Saito
2007/0164434 A1*  7/2007  Watanabe ........... H01L 23/5223
                                                   257/758
(Continued)

FOREIGN PATENT DOCUMENTS

JP    2004-134498 A    4/2004
JP    2008-147588 A    6/2008
(Continued)

OTHER PUBLICATIONS

English Translated document of JP2011-77468A, downloaded Jul. 3, 2016.*

*Primary Examiner* — Thomas L Dickey
*Assistant Examiner* — Changhyun Yi
(74) *Attorney, Agent, or Firm* — Canon U.S.A. Inc. IP Division

(57) ABSTRACT

A semiconductor device manufacturing method includes a step of forming a hole reaching a first insulating layer over a first conductive member; a step of forming a trench reaching a second insulating layer and in communication with the hole; a step of forming an opening exposing the first conductive member in the hole; and a step of forming a second conductive member connected to the first conductive member by embedding a conductive material in the opening, the hole, and the trench. The trench is formed under an etching condition such that the etching rate with respect to the second insulating layer is lower than the etching rate with respect to the third insulating layer.

19 Claims, 2 Drawing Sheets

(51) Int. Cl.
*H01L 21/311* (2006.01)
*H01L 21/768* (2006.01)

(52) U.S. Cl.
CPC .... *H01L 21/76808* (2013.01); *H01L 27/1462* (2013.01); *H01L 27/14612* (2013.01); *H01L 27/14627* (2013.01); *H01L 27/14632* (2013.01); *H01L 27/14638* (2013.01); *H01L 27/14687* (2013.01); *H01L 21/76804* (2013.01); *H01L 2221/1036* (2013.01)

(58) Field of Classification Search
USPC .................................. 438/701, 723; 257/291
See application file for complete search history.

(56) References Cited

U.S. PATENT DOCUMENTS

| | | | | |
|---|---|---|---|---|
| 2009/0278967 A1* | 11/2009 | Toumiya | ........... | H01L 27/14625 348/294 |
| 2011/0294276 A1* | 12/2011 | Kuroki | .............. | H01L 21/31116 438/381 |
| 2012/0202312 A1* | 8/2012 | Suzuki | .............. | H01L 27/14687 438/73 |
| 2013/0252384 A1* | 9/2013 | Ryu | ........................ | H01L 21/28 438/158 |

FOREIGN PATENT DOCUMENTS

| | | | | | |
|---|---|---|---|---|---|
| JP | 2009-4633 A | | 1/2009 | | |
| JP | 2010-087190 A | | 4/2010 | | |
| JP | 2011-77468 A | * | 4/2011 | ........ | H01L 21/31116 |
| JP | 2012-104667 A | | 5/2012 | | |
| WO | 2011039898 A1 | | 4/2011 | | |

* cited by examiner

SEMICONDUCTOR DEVICE MANUFACTURING METHOD, AND PHOTOELECTRIC CONVERSION DEVICE

BACKGROUND

Field of the Invention

The present disclosure relates to a semiconductor device manufacturing method using dual damascene method, and a photoelectric conversion device.

Description of the Related Art

In Japanese Patent Application Laid-Open No. 2008-147588, a via-first dual damascene method is disclosed. In Japanese Patent Application Laid-Open No. 2008-147588, etching stoppers (104, 107) are disposed under a wiring interlayer film (103) and a via interlayer film (105).

In Japanese Patent Application Laid-Open No. 2010-087190, it is described that a dual damascene structure is configured in which a third plug (216) and a first wiring (217) are connected to a second plug (212). It is also described that a second opening (216h) in which the third plug (216) is disposed is formed in a second insulating film (214) first, and then a first opening (217h) in which the first wiring (217) is disposed is formed in a third insulating film (215).

In Japanese Patent Application Laid-Open No. 2008-147588, in order to form four types of insulators included in a wiring structure, it is necessary to perform film formation four times, which is disadvantageous in obtaining a low profile wiring structure. When it is attempted to reduce the thickness of the four types of insulators for achieving low profile, it may become difficult to perform uniform film formation of the respective insulators, or sufficient etching stopper function may not be obtained, resulting in a decrease in reliability.

When the second opening is formed first as in Japanese Patent Application Laid-Open No. 2010-087190, the earlier-exposed second plug is exposed to the etching for forming the first opening. As a result, the second plug may be damaged, the resistance of the second plug may be increased, or contamination may be caused due to metal included in the second plug. Thus, reliability may be decreased.

An object of the present disclosure is to provide a semiconductor device manufacturing method such that both low profile and reliability are achieved. Another object of the present disclosure is to increase the sensitivity of a photoelectric conversion device.

SUMMARY

According to a first means for solving the problem, a semiconductor device manufacturing method includes a step of forming an insulating film on a first conductive member, the insulating film including a first insulating layer, a second insulating layer, and a third insulating layer, the second insulating layer being positioned between the first insulating layer and the third insulating layer and providing an interface between the first insulating layer and the third insulating layer; a step of forming a hole reaching the first insulating layer over the first conductive member by etching the third insulating layer and the second insulating layer using a first mask; a step of forming a trench reaching the second insulating layer and in communication with the hole by etching the third insulating layer using a second mask after the first mask is removed; a step of forming an opening exposing the first conductive member to the hole by etching the first insulating layer after the hole and the trench are formed; and a step of forming a second conductive member connected to the first conductive member by embedding a conductive material in the opening, the hole, and the trench. The trench is formed under an etching condition such that an etching rate with respect to the second insulating layer is lower than an etching rate with respect to the third insulating layer.

According to a second means for solving the problem, a semiconductor device includes a semiconductor substrate including a photoelectric conversion unit; a first conductive member disposed on the semiconductor substrate; a second conductive member disposed on the first conductive member; and an insulating film covering the photoelectric conversion unit. The second conductive member includes a plug portion and a wiring portion. The insulating film includes a first insulating layer surrounding the plug portion, a second insulating layer surrounding the plug portion and the wiring portion, and a third insulating layer surrounding the wiring portion. The second insulating layer is positioned between the first insulating layer and the third insulating layer and provides an interface between the first insulating layer and the third insulating layer. The second insulating layer has a refractive index lower than a refractive index of the first insulating layer and higher than a refractive index of the third insulating layer.

Further features of the present disclosure will become apparent from the following description of exemplary embodiments (with reference to the attached drawings).

DESCRIPTION OF THE EMBODIMENTS

In the following, modes for carrying out the present invention will be described with reference to the drawings. In the following description and drawings, common features are designated with common signs throughout several views. Thus, the common features will be described with mutual reference to a plurality of drawings, while not providing the description of the features designated with common signs as needed.

Figure 1:
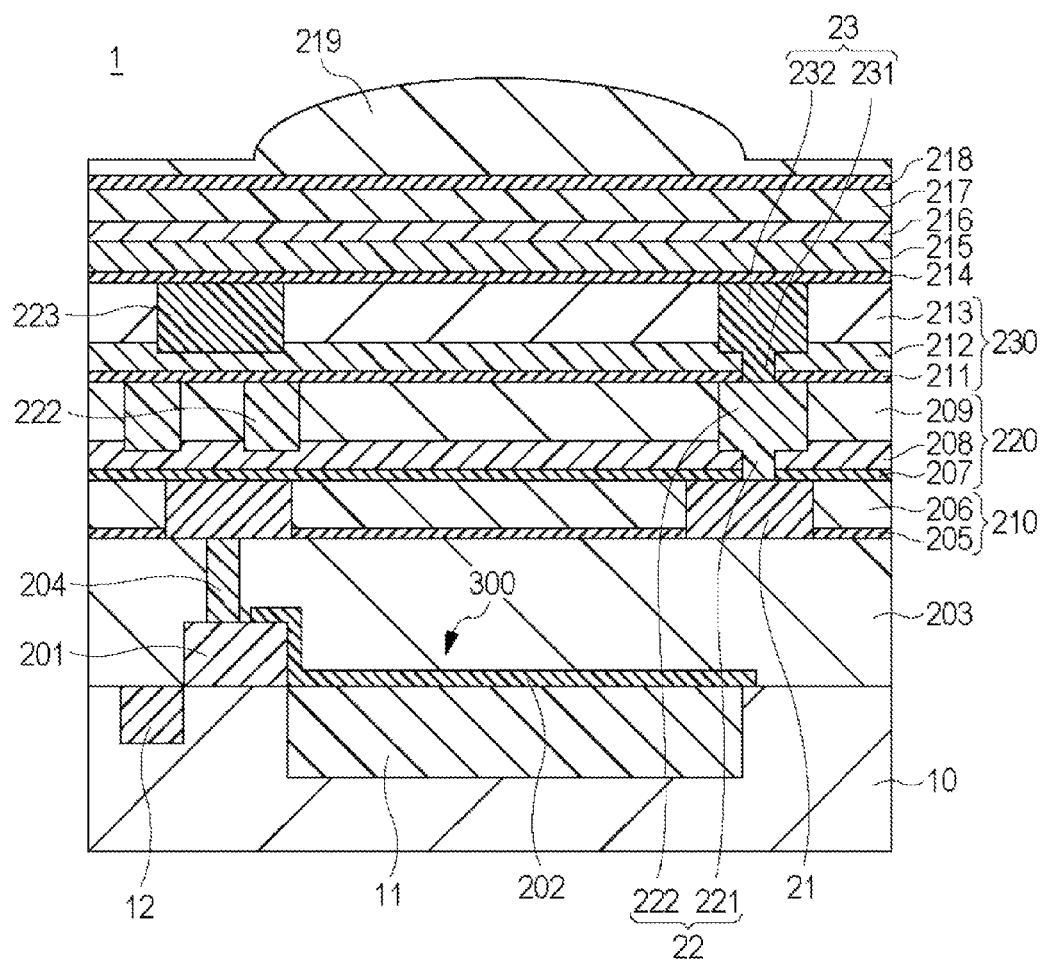
FIG. 1 is a schematic cross sectional view illustrating an example of a semiconductor device.

FIG. 1 is a schematic cross sectional view of a photoelectric conversion device 1 as an example of a semiconductor device. In FIG. 1, in a semiconductor substrate 10 made of silicon and the like, a photoelectric conversion unit 11 including a photo diode and the like is disposed. Signal charges generated in the photoelectric conversion unit 11 are transferred to a floating diffusion region 12 via a transfer gate including a gate electrode 201 made of polysilicon and the like. An amplifying transistor, which is not shown, is connected to the floating diffusion region 12 and produces a pixel signal. The configuration of the semiconductor substrate 10 may be applied in a CMOS solid imaging device.

On the semiconductor substrate 10, a protection film 202 is disposed, covering the photoelectric conversion unit 11. The protection film 202 is made of silicon nitride and the like, and may also function as a reflection preventing film for suppressing the reflection of light incident on the photoelectric conversion unit 11.

The photoelectric conversion unit 11, the gate electrode 201, and the floating diffusion region 12 are covered by an insulating film 203 of a silicon oxide film formed on the semiconductor substrate 10. The insulating film 203 is penetrated by a contact plug 204 connected to the gate electrode 201. In the insulating film 203, there is also disposed a contact plug connected to the gate, source, and drain of a MOS transistor, not shown, on the semiconductor substrate 10.

On the insulating film 203, there are disposed an insulating film 210 and a conductive member 21 formed in the insulating film 210 and containing copper. The conductive member 21 includes a single damascene structure. The insulating film 210 is a multilayer film including insulating layers 205 and 206.

On the insulating film 210 and the conductive member 21, there are disposed an insulating film 220 and a conductive member 22 formed in the insulating film 220 and containing copper. The conductive member 22 has a dual damascene structure including a plug portion 221 and a wiring portion 222. The insulating film 220 is a multilayer film including insulating layers 207, 208, and 209. The plug portion 221 is surrounded by the insulating layer 207. This means that a part (lower part) of the plug portion 221 and the insulating layer 207 are positioned in the same plane parallel with the surface of the semiconductor substrate 10. The plug portion 221 is also surrounded by the insulating layer 208. This means that another part (upper part) of the plug portion 221 and a part (lower part) of the insulating layer 208 are positioned in the same plane parallel with the surface of the semiconductor substrate 10. Further, the wiring portion 222 is surrounded by the insulating layer 208. This means that a part (lower part) of the wiring portion 222 and another part (upper part) of the insulating layer 208 are positioned in another same plane parallel with the surface of the semiconductor substrate 10. The wiring portion 222 is surrounded by the insulating layer 209. This means that another part (upper part) of the wiring portion 222 and the insulating layer 209 are positioned in the same plane parallel with the surface of the semiconductor substrate 10.

The insulating layer 208 is positioned between the insulating layer 207 and the insulating layer 209, providing an interface between the insulating layer 207 and the insulating layer 209. Preferably, the insulating layer 208 has a refractive index smaller than a refractive index of the insulating layer 207. Preferably, the refractive index of the insulating layer 208 is higher than a refractive index of the insulating layer 209. Preferably, the insulating layer 208 has a thickness greater than a thickness of the insulating layer 207. Preferably, the thickness of the insulating layer 208 is smaller than a thickness of the insulating layer 209. Thus, by increasing the refractive index as the thickness of the insulating layer is decreased, light can be guided to the photoelectric conversion unit 11 via an appropriate optical path.

On the insulating film 220 and the conductive member 22, there is disposed a conductive member 23 formed in an insulating film 230 and containing copper. The conductive member 23 has a dual damascene structure including a plug portion 231 and a wiring portion 232. The insulating film 230 is a multilayer film including insulating layers 211, 212, and 213. The plug portion 231 is surrounded by the insulating layer 211. The plug portion 231 and the wiring portion 232 are surrounded by the insulating layer 212. The wiring portion 232 is surrounded by the insulating layer 213. At the same height as the wiring portion 232, there is disposed a wiring portion 223 formed simultaneously with the wiring portion 232. The wiring portion 223 is also surrounded by the insulating layer 212 and the insulating layer 213.

The insulating layer 212 is positioned between the insulating layer 211 and the insulating layer 213, providing an interface between the insulating layer 211 and the insulating layer 213. Preferably, the insulating layer 212 has a refractive index smaller than a refractive index of the insulating layer 211. Preferably, the refractive index of the insulating layer 212 is greater than a refractive index of the insulating layer 213. Preferably, the insulating layer 212 has a thickness greater than a thickness of the insulating layer 211. Preferably, the thickness of the insulating layer 212 is smaller than a thickness of the insulating layer 213. The relationship between the insulating film 230 and the conductive member 23 may be described in the same way as for the relationship between the insulating film 220 and the conductive member 22.

On the insulating film 230 and the conductive member 23, a passivation film 216 is disposed via a diffusion prevention layer 214 and an insulating layer 215. On the passivation film 216, there are successively disposed a color filter 217 and a planarizing film 218, on which there is further disposed a micro lens 219. The various films other than the insulating film 220 and the insulating film 230, such as the planarizing film and passivation film, may be multilayer films or single layer films.

When the semiconductor device is used as a photoelectric conversion device, light 300 condensed by the micro lens 219 passes through a number of insulating layers before entering the photoelectric conversion unit 11. For example, focus on the insulating layers 207, 208, and 209. With regard to the refractive index of the insulating layers 207, 208, and 209 of the insulating film 220, when the relationship of insulating layer 209<insulating layer 208<insulating layer 207 is satisfied, the structure is such that the refractive index is gradually changed. In this layer configuration, light is more difficult to be reflected than in a structure without the insulating layer 208. The same applies to the insulating layers 211, 212, and 213 of the insulating film 230. Thus, in the insulating films 220 and 230, the light utilization efficiency is increased compared with when the insulating layer 208 and the insulating layer 212 are absent, whereby a sensitivity increasing effect can be obtained.

With reference to FIGS. 2A to 2J, a step of forming a conductive member in a semiconductor device manufacturing method will be described. In the following description, the conductive member forming step may be applied to either the combination of the conductive member 22 and its surrounding insulating film 220, or the combination of the conductive member 23 and its surrounding insulating film 230. In the following, for convenience, the forming step will be described on the assumption that a conductive member 92 shown in FIG. 2J corresponds to the conductive member 21 of FIG. 1, an insulating film 100 shown in FIG. 2J corresponds to the insulating film 220 of FIG. 1, and a conductive member 140 shown in FIG. 2J corresponds to the conductive member 22 of FIG. 1.

Figure 2A:
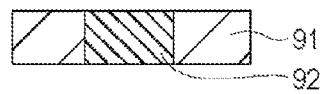
FIGS. 2A to 2J are schematic cross sectional views illustrating an example of a semiconductor device manufacturing method.

First, as shown in FIG. 2A, the first conductive member 92 containing conductive material such as copper, aluminum, tungsten, tantalum, and titanium is formed on a semiconductor substrate (not shown) by a method well known in the art. The present embodiment is preferable when the first conductive member 92 is a copper-containing member. The first conductive member 92 containing copper is typically embedded in an insulating layer 91 by damascene method. While the conductive member 21 of FIG. 1 corresponding to the first conductive member 92 is embedded by single damascene method, dual damascene method may be used.

Figure 2B:
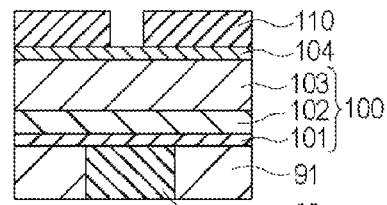

Then, as shown in FIG. 2B, on the first conductive member 92, the insulating film 100 including a first insulating layer 101, a second insulating layer 102, and a third insulating layer 103 is formed. In the insulating film 100, the second insulating layer 102 is disposed between the first insulating layer 101 and the third insulating layer 103, providing an interface between the first insulating layer 101 and the third insulating layer 103. On the insulating film 100, a first protection layer 104 is formed. For the first insulating layer 101, the second insulating layer 102, the third insulating layer 103, and the first protection layer 104, insulator films may be successively formed by CVD process and the like. When the semiconductor substrate includes a photoelectric conversion unit as in the case of FIG. 1, the insulating film 100 is formed on the semiconductor substrate in such a manner as to cover the photoelectric conversion unit.

Preferably, the second insulating layer 102 has a thickness greater than a thickness of the first insulating layer 101 and smaller than a thickness of the third insulating layer 103. Preferably, the second insulating layer 102 has a refractive index smaller than a refractive index of the first insulating layer 101 and greater than a refractive index of the third insulating layer 103. The first insulating layer 101 is silicon carbide (SiC or SiCO) formed by PECVD process, for example, and has a thickness on the order of 25 to 75 nm and a refractive index on the order of 1.75 to 1.90. The second insulating layer 102 is silicon nitride (SiN or SiON) formed by PECVD process, for example, and has a thickness on the order of 50 to 100 nm, and a refractive index on the order of 1.50 to 1.75. The third insulating layer 103 is silicon oxide (SiO or silicate glass) formed by PECVD process, for example, and has a thickness on the order of 100 to 200 nm and a refractive index on the order of 1.40 to 1.50. The first protection layer 104 is silicon nitride (SiN), for example, and has a thickness on the order of 10 to 50 nm.

Further, on the insulating film 100 (on the first protection layer 104), a first mask 110 is formed. The first mask 110 is formed by photolithography by which a photosensitive resin film (photoresist film) is patterned by exposure and development. The pattern of the first mask 110 may be determined in accordance with the layout of the plug portions formed in the conductive member. The first mask 110 has a pattern such that an opening portion is positioned over the first conductive member 92. The first protection layer 104 functions as a protection layer for the top layer of the insulating film 100 (which is the third insulating layer 103 in the present example) in a subsequent step, and may also function as an antireflection layer for suppressing the reflection of light during exposure for forming the first mask 110.

Figure 2C:
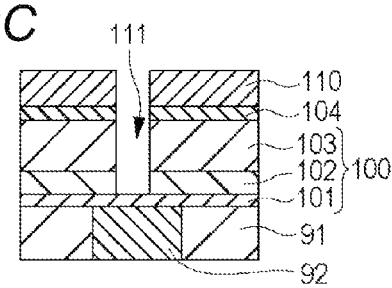

Then, as shown in FIG. 2C, the first protection layer 104, the third insulating layer 103, and the second insulating layer 102 are etched using the first mask 110. Thereby, a hole 111 is formed in the first protection layer 104, the third insulating layer 103, and the second insulating layer 102, reaching the first insulating layer 101. Thus, the upper surface of the first insulating layer 101 is exposed in the hole 111. The hole 111 is positioned over the first conductive member 92. During the etching of the second insulating layer 102, an etching condition is adopted such that the etching rate with respect to the first insulating layer 101 is lower than the etching rate with respect to the second insulating layer 102. In this way, the first insulating layer 101 functions as an etching stopper. During the etching of the second insulating layer 102, it is preferable to maintain a constant etching condition in order to stably form the hole 111; however, the etching condition may be changed during the etching of the second insulating layer 102. Preferably, the first protection layer 104, third insulating layer 103, and the second insulating layer 102 are etched by dry etching, such as reactive ion etching (RIE). The etching condition for realizing this may include, for example in the case of plasma etching, the type of process gas depending on the difference in material of the first insulating layer 101 and the second insulating layer 102, the flow rate or pressure of the gas, and plasma electric power. As the process gas for the respective insulating layers and the respective protection layers shown above by way of example, a mixture gas of $C_xF_y$, $C_xH_yF_z$, Ar, $O_2$ and the like may be used. Thereafter, the first mask 110 is removed.

Figure 2D:
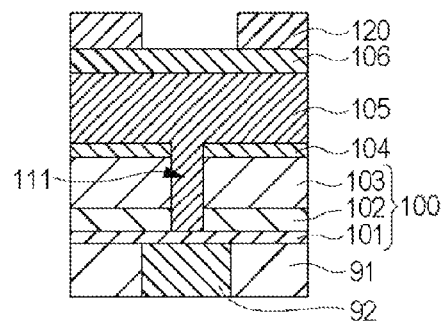

Then, as shown in FIG. 2D, in the hole 111 and on the insulating film 100 (on the first protection layer 104), a second protection layer 105 is formed. For the second protection layer 105, a resin layer formed by coating process may be used. Thereafter, on the second protection layer 105, a third protection layer 106 is formed. The third protection layer 106 is silicon oxide (TEOS-SiO) formed by PECVD process, for example, and has a thickness on the order of 50 to 200 nm. Preferably, the second protection layer 105 has a thickness greater than the thickness of the first protection layer 104 or the thickness of the third protection layer 106. The first protection layer 104, the second protection layer 105, and the third protection layer 106 are layers for protecting the insulating layers 101, 102, and 103 in the insulating film 100 during the subsequent etching process.

On the insulating film 100 (on the third protection layer 106), a second mask 120 is formed. The second mask 120 is formed by photolithography to pattern a photosensitive resin film (a photoresist film) through exposure and development. The pattern of the second mask 120 may be determined in accordance with the layout of the wiring portion of the conductive member, to be formed. The second mask 120 has a pattern such that an opening portion is positioned over the hole 111. The third protection layer 106 functions as a protection layer for the second protection layer 105 in a subsequent step, and may also function as an antireflection layer for suppressing light reflection during exposure for forming the second mask 120. The third protection layer 106 may function as a hard mask for transferring the pattern of the second mask 120 onto the second protection layer 105.

Figure 2E:
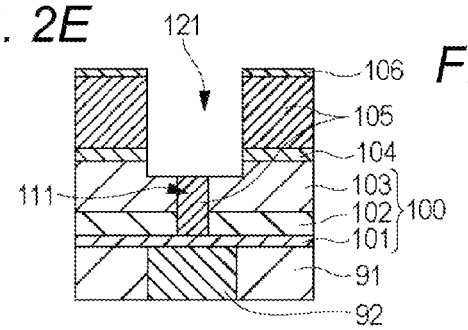
Figure 2F:
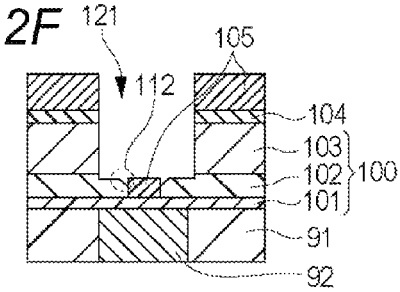

Next, as shown in FIGS. 2E and 2F, the third protection layer 106, the second protection layer 105, the first protection layer 104, and the third insulating layer 103 are etched using the second mask 120 to form a trench 121 reaching the second insulating layer 102. At the bottom of the trench 121, the hole 111 is positioned in communication with the trench 121.

FIG. 2E illustrates a state during transition to the state of FIG. 2F. The etching condition for the respective protection layers and insulating layers may be varied depending on the material of the layer as the object of etching. The trench 121 is formed by etching the third insulating layer 103 under the etching condition where the etching rate with respect to the second insulating layer 102 is lower than the etching rate with respect to the third insulating layer 103. Preferably, during the etching of the third insulating layer 103, a constant etching condition is maintained so as to stably form the trench 121; however, the etching condition may be changed during the etching of the third insulating layer 103. While in the example of FIG. 2F the second insulating layer 102 is etched to form the trench 121, the second insulating layer 102 may not be etched if the upper surface of the second insulating layer 102 can be exposed in the trench 121.

Preferably, the third protection layer 106, the second protection layer 105, the first protection layer 104, and the third insulating layer 103 are etched by dry etching, such as reactive ion etching (RIE). The etching condition for realizing this may include, for example in the case of plasma etching, the type of process gas depending on the difference in material of the second insulating layer 102 and the third insulating layer 103, the flow rate or pressure of the gas, and plasma electric power. As the process gas for the respective insulating layers and protection layers individual above by way of example, a mixture gas of $C_xF_y$, $C_xH_yF_z$, Ar, $N_2$, $O_2$, and the like may be used.

As shown in FIGS. 2E and 2F, during the etching for forming the trench 121, at the bottom of the trench 121, there exists a boundary portion 112 between the hole 111 and the trench 121. Because the boundary portion 112 is a corner portion where the upper surface and the side of the third insulating layer 103 or the second insulating layer 102 are connected, etching progresses easily. Thus, the diameter of the hole 111 could be extremely increased at the boundary portion 112. Such increase in the diameter of the hole 111 could cause wiring formation failure. The increase in the hole 111 can be suppressed by etching the third insulating layer 103 under the etching condition described above.

The details of the mask for forming the trench 121 will be described. FIG. 2E shows a stage in the course of formation of the trench 121. During the etching of the second protection layer 105 for forming the trench 121, the second mask 120 could be etched and eliminated. Thus, in the forming of the trench 121 in the third insulating layer 103, the etched third protection layer 106 substantially functions as a second mask.

Further, during the etching of the second protection layer 105, the first protection layer 104 or the third insulating layer 103, the third protection layer 106 could also be etched and eliminated. Thus, during the formation of the trench 121 in the third insulating layer 103, the etched second protection layer 105 substantially functions as a second mask. FIG. 2E shows the state immediately before the third protection layer 106 is eliminated during the etching of the third insulating layer 103. The timing of elimination of the third protection layer 106 may be not during the etching of the third insulating layer 103 but during the etching of the second protection layer 105 or the first protection layer 104.

Figure 2G:
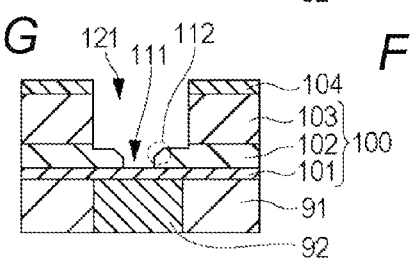
Figure 2H:
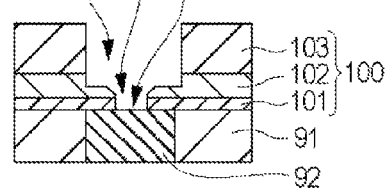

Then, as shown in FIGS. 2G and 2H, the second protection layer 105 is removed, whereby the first insulating layer 101 is exposed in the hole 111. Also, the first protection layer 104 is exposed. By etching the first insulating layer 101 using the first protection layer 104 and the second insulating layer 102 as a mask, an opening 130 is formed exposing the first conductive member 92 in the hole 111. Specifically, the opening 130 is formed by etching the first insulating layer 101 under an etching condition such that the etching rate with respect to the second insulating layer 102 is lower than the etching rate with respect to the first insulating layer 101. In this way, the etching of the second insulating layer 102 can be suppressed, and the increase in the diameter of the hole 111 at the boundary portion 112 can be suppressed.

For the removal of the second protection layer 105, asking may be employed. Preferably, the first insulating layer 101 is etched by dry etching, such as reactive ion etching (RIE). The etching condition for realizing this may include, for example in the case of plasma etching, the type of process gas depending on the difference in material of the first insulating layer 101 and the second insulating layer 102, the flow rate or pressure of the gas, and plasma electric power. As the process gas for the respective insulating layers and protection layers shown above by way of example, a mixture gas of $C_xF_y$, $C_xH_yF_z$, Ar, $O_2$, and the like may be used.

In the initial period of etching of the first insulating layer 101, the upper surface of the third insulating layer 103 is covered with the first protection layer 104. However, as the first insulating layer 101 is etched, the first protection layer 104 is etched and could finally been eliminated.

As described above, in the series of steps of forming the hole 111 and the trench 121, the first conductive member 92 is not exposed and instead covered with the first insulating layer 101 until the opening 130 is formed. Thus, damage to the first conductive member 92 during the formation of the hole 111 or the trench 121 can be suppressed. Further, an increase in resistance due to oxidation of metal in the first conductive member 92 can be suppressed. Contamination by the metal included in the first conductive member 92 can also be suppressed. This is particularly effective when the metal contained in the first conductive member 92 is copper, which tends to readily cause a phenomenon such as oxidation or diffusion, compared with aluminum or tungsten and the like.

Figure 2I:
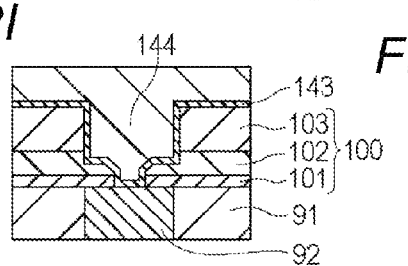

Thereafter, as shown in FIG. 2I, a conductive material is embedded in the opening 130, the hole 111, and the trench 121. For example, a barrier metal film 143 of Ta, TaN or the like is formed along the surface of the hole 111 and the trench 121. Then, on the barrier metal film 143, a copper film 144 filling the hole 111 and the trench 121 is formed by plating and the like.

Figure 2J:
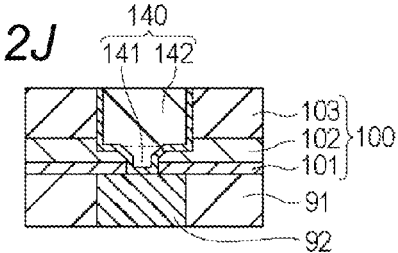

As shown in FIG. 2J, excess portions of the copper film 144 and the barrier metal film 143 outside the trench 121 are removed by CMP process and the like, whereby the second conductive member 140 is formed. The second conductive member 140 has a structure (dual damascene structure) in which a plug portion 141 positioned in the opening 130 and the hole 111 is integral with the wiring portion 142 positioned in the trench 121.

Thereafter, a diffusion prevention layer (not shown) for preventing the diffusion of copper contained in the second conductive member 140 is formed, covering the second conductive member 140 and the insulating film 100. When the above-described steps of forming the second conductive member 140 are applied in the formation of the conductive member 22 described with reference to FIG. 1, for example, the diffusion prevention layer may be used as the insulating layer 211. When the above-described steps of forming the second conductive member 140 are applied in the formation of the conductive member 23 described with reference to FIG. 1, the insulating layer 211 as the diffusion prevention layer of the conductive member 22 may be used as the first insulating layer 101.

In a conventional insulating layer film formation method, a certain thickness is required in order to form a single insulating layer with uniform thickness. Thus, an increase in the number of layers of an insulating film made of a plurality of insulating layers means an increase in the thickness of the insulating film. However, according to the present embodiment described above, the insulator left around the second conductive member 140 as a final structure requires only the three layers of the first insulating layer 101, the second insulating layer 102, and the third insulating layer 103. Thus, even when sufficiently thick insulating layers are formed so as to ensure uniformity or flatness which relate to reliability, the insulating film 100 can be made thin, thus making it possible to obtain a low profile wiring structure. As a result, sensitivity can be increased in a photoelectric conversion device using in the low profile wiring structure. Further, compared with when the number of layers in the insulating film 100 is four or more, the number of interfaces between the insulating layers can be decreased. Accordingly, optical loss due to reflection of light by the insulating layer interfaces can be decreased, and sensitivity can be increased.

The above-described embodiment may be modified as needed without departing from the concept of the present disclosure. While a photoelectric conversion device has been described as an example of the semiconductor device, the semiconductor device may include a computing device, a storage device, a display device and the like. The embodiment, which makes it possible to obtain a low profile wiring structure, enables integration and reduction in size.

According to the present invention, a semiconductor device manufacturing method that achieves low profile can be provided.

According to the present invention, a photoelectric conversion device having increased sensitivity can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-025732, filed Feb. 13, 2014, which is hereby incorporated by reference herein in its entirety.

What is claimed is:

1. A semiconductor device manufacturing method comprising:
   forming an insulating film on a first conductive member, the insulating film including a first insulating layer, a second insulating layer, and a third insulating layer, the second insulating layer being made of a material different from a material of the first insulating layer and a material of the third insulating layer, the second insulating layer being positioned between the first insulating layer and the third insulating layer so that the second insulating layer provides a first interface between the first insulating layer and the second insulating layer and provides a second interface between the second insulating layer and the third insulating layer;
   forming a hole reaching the first insulating layer over the first conductive member by etching the third insulating layer and the second insulating layer using a first mask;
   forming a trench reaching the second insulating layer and in communication with the hole by etching the third insulating layer using a second mask after the first mask is removed;
   forming an opening exposing the first conductive member to the hole by etching the first insulating layer after the hole and the trench are formed; and
   forming a second conductive member connected to the first conductive member by embedding a conductive material in the opening, the hole, and the trench,
   wherein when forming the hole, a protection layer is positioned between the first mask and the third insulating layer, and when forming the trench, the protection layer is positioned between the second mask and the third insulating layer, and
   wherein the trench is formed via an etching condition such that an etching rate with respect to the second insulating layer is less than an etching rate with respect to the third insulating layer.

2. The semiconductor device manufacturing method according to claim 1, wherein, when forming the trench, another protection layer is disposed in the hole in contact with the first insulating layer.

3. The semiconductor device manufacturing method according to claim 1, wherein the opening is formed via an etching condition such that an etching rate with respect to the second insulating layer is less than an etching rate with respect to the first insulating layer.

4. The semiconductor device manufacturing method according to claim 1, wherein:
   the insulating film is formed over a semiconductor substrate including a photoelectric conversion unit;
   the first conductive member contains copper; and
   the insulating film is formed to cover the photoelectric conversion unit.

5. The semiconductor device manufacturing method according to claim 4, wherein the second insulating layer has a thickness greater than a thickness of the first insulating layer and smaller than a thickness of the third insulating layer.

6. The semiconductor device manufacturing method according to claim 5, wherein the second insulating layer has a refractive index less than a refractive index of the first insulating layer and greater than a refractive index of the third insulating layer.

7. The semiconductor device manufacturing method according to claim 1, wherein the first insulating layer is made of silicon carbide, the second insulating layer is made of silicon nitride, and the third insulating layer is made of silicon oxide.

8. The semiconductor device manufacturing method according to claim 1, wherein when forming the opening, the protection layer is etched.

9. The semiconductor device manufacturing method according to claim 1, wherein when forming the trench, another protection layer positioned between the second mask and the protection layer is eliminated.

10. The semiconductor device manufacturing method according to claim 1, wherein the first insulating layer is made of SiC or SiCO, the second insulating layer is made of SiN or SiON, and the third insulating layer is made of SiO or silicate glass.

11. The semiconductor device manufacturing method according to claim 1, wherein the second insulating layer is the only insulating layer that is positioned between the first insulating layer and the third insulating layer.

12. The semiconductor device manufacturing method according to claim 1, wherein the second insulating layer is a single layer.

13. The semiconductor device manufacturing method according to claim 1, wherein the insulating film consists of the first insulating layer, the second insulating layer, and the third insulating layer.

14. The semiconductor device manufacturing method according to claim 1, wherein a thickness of the second insulating layer and a thickness of the third insulating layer are greater than a thickness of the first insulating layer.

15. The semiconductor device manufacturing method according to claim 14, wherein the second insulating layer is etched in the step of forming the trench before the first insulating layer is etched in the step of forming the opening.

16. The semiconductor device manufacturing method according to claim 15, wherein the second insulating layer is etched in the step of forming the opening.

17. The semiconductor device manufacturing method according to claim 14, wherein the thickness of the second insulating layer and the thickness of the third insulating layer are greater than a thickness of the protection layer.

18. The semiconductor device manufacturing method according to claim 17, wherein when forming the trench, the second mask is eliminated.

19. The semiconductor device manufacturing method according to claim 1, wherein the first insulating layer, the second insulating layer, and the third insulating layer are formed by PECVD process.

\* \* \* \* \*